(12) United States Patent
Gundlach et al.

(10) Patent No.: US 6,935,521 B2
(45) Date of Patent: Aug. 30, 2005

(54) ADJUSTABLE APPARATUS TO SUPPORT AN ELECTRONIC DEVICE WITHIN A RACK

(75) Inventors: John Geoffrey Gundlach, Durham, NC (US); Dean Frederick Herring, Youngsville, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/252,644

(22) Filed: Sep. 23, 2002

(65) Prior Publication Data

US 2004/0055984 A1 Mar. 25, 2004

(51) Int. Cl.⁷ .............................. A47F 5/00; A47F 7/00; A47B 88/00
(52) U.S. Cl. ..................... 211/183; 211/26; 312/334.44
(58) Field of Search ............... 312/333, 334.44–334.47, 312/265.1–265.4; 24/26, 175, 190, 189, 183, 191, 186; 248/273.3, 298.1

(56) References Cited

U.S. PATENT DOCUMENTS

| | | | | |
|---|---|---|---|---|
| 4,524,974 A | * | 6/1985 | Matsuura ..................... 473/396 |
| 4,872,734 A | * | 10/1989 | Rechberg ..................... 312/333 |
| 5,560,572 A | * | 10/1996 | Osborn et al. ............. 248/27.3 |
| 5,571,256 A | | 11/1996 | Good et al. |
| 5,633,744 A | * | 5/1997 | Nakajima ................... 359/196 |
| 5,722,750 A | * | 3/1998 | Chu ....................... 312/334.11 |
| 5,833,337 A | * | 11/1998 | Kofstad .................... 312/334.5 |
| 5,951,132 A | * | 9/1999 | Cirocco ................. 312/334.46 |
| 6,230,903 B1 | * | 5/2001 | Abbott ......................... 211/26 |
| 6,318,679 B1 | * | 11/2001 | Yang et al. ................. 248/27.1 |
| 6,340,078 B1 | * | 1/2002 | Scheible ...................... 188/166 |
| 6,367,899 B1 | * | 4/2002 | Hwang et al. ......... 312/334.47 |
| 6,375,290 B1 | * | 4/2002 | Lin et al. ............... 312/334.46 |
| 6,412,891 B1 | * | 7/2002 | Liang et al. ........... 312/334.44 |
| 6,450,600 B1 | * | 9/2002 | Chen et al. ............ 312/334.46 |
| 6,457,790 B1 | * | 10/2002 | Liang et al. ........... 312/334.46 |
| 6,585,337 B1 | * | 7/2003 | Chen et al. ............ 312/334.46 |
| 6,592,000 B1 | * | 7/2003 | Owens et al. ............... 220/324 |
| 6,601,713 B2 | * | 8/2003 | Kaminski ..................... 211/26 |
| 6,601,933 B1 | * | 8/2003 | Greenwald .................. 312/333 |
| 6,626,300 B2 | * | 9/2003 | Kaminski et al. ............. 211/26 |
| 6,644,480 B2 | * | 11/2003 | Kaminski ..................... 211/26 |
| 6,666,340 B2 | * | 12/2003 | Basinger et al. .............. 211/26 |
| 6,672,692 B2 | * | 1/2004 | Weng ......................... 312/333 |
| 6,685,033 B1 | * | 2/2004 | Baddour et al. .............. 211/26 |

* cited by examiner

*Primary Examiner*—Hugh B. Thompson, II
(74) *Attorney, Agent, or Firm*—Joseph P. Lally; Martin J. McKinley

(57) ABSTRACT

An adjustable apparatus for supporting an electronic device within a rack including a fixed rail, a sliding rail, and a latch. The sliding rail is adjustably receivable within the fixed rail. The latch maintains the relative positions of the sliding and fixed rails to define a length of the apparatus that accommodates a dimension of the rack. The fixed rail may be an L-shaped bracket including a plurality of locating points which interact with the latch to maintain the position of the fixed and sliding rails, a plurality of tabs suitable for receiving the sliding rail; and at least one mounting feature suitable for attaching to the rack. The sliding rail may include a mounting feature suitable for attaching to the rack, ribs that interact with the latch, and an attachment point. The latch typically includes a lever body and a tension member to which the attachment point attaches.

14 Claims, 3 Drawing Sheets

ADJUSTABLE APPARATUS TO SUPPORT AN ELECTRONIC DEVICE WITHIN A RACK

FIELD OF THE INVENTION

The present invention relates to the field of rack-mounted devices and, more particularly, the present invention provides an adjustable apparatus to support electronic devices within racks of differing depths.

BACKGROUND

Electronic devices, including data processing devices such as servers, may be housed in standardized equipment enclosures. Each such enclosure may have an outer, aesthetically pleasing housing that is supported by an inner rack. The rack is a substantially rectilinear metal frame including several vertical columns each provided with a plurality of mounting and alignment openings or holes that permit mounting various devices in the rack.

Rails that mount to the vertical members or columns of the rack support the devices or components. The rails are screwed, bolted, or otherwise attached to the rack and the devices are placed on a pair or set of rails. In order to be attached to the rack the length of the rails must conform to the depth of the rack. Commercially available rack systems vary in depth, typically from 18" to 32" in increments of 1 inch. Thus a consumer must obtain rails of the correct length or be supplied with rails that can adjust in length to accommodate installation in racks of differing depths. It would, therefore, be desirable to implement an apparatus and system in which the rails can adjust to the depth of the rack.

SUMMARY OF THE INVENTION

The problems identified above are addressed by an adjustable apparatus for supporting an electronic device within a rack including a fixed rail, a sliding rail, and a latch. The sliding rail is adjustably receivable within the fixed rail. The latch maintains the relative positions of the sliding and fixed rails to define a length of the apparatus that accommodates a dimension of the rack. The fixed rail may be an L-shaped bracket including a plurality of locating points which interact with the latch to maintain the position of the fixed and sliding rails, a plurality of tabs suitable for receiving the sliding rail; and at least one mounting feature suitable for attaching to the rack. The sliding rail may include a mounting feature suitable for attaching to the rack, ribs that interact with the latch, and an attachment point. The latch typically includes a lever body and a tension member to which the attachment point attaches.

BRIEF DESCRIPTION OF THE DRAWINGS

Other objects and advantages of the invention will become apparent upon reading the following detailed description and upon reference to the accompanying drawings in which like reference numerals indicate like elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations or embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, the present invention contemplates a mounting rail apparatus that may be adjusted to fit into racks of differing depths. The apparatus typically comprises a fixed rail member with a plurality of locating points and a sliding rail member with a latching mechanism affixed to it. In use, the latching mechanism is unlatched from one of the plurality of locating points, allowing the sliding rail member to move relative to the fixed rail member. When the combined length of the sliding rail and the fixed rail members is appropriate for the rack, the latching mechanism is again latched into one of the locating points, thereby setting and maintaining the rail apparatus at the appropriate length for installation into the rack. The increments of length adjustment possible for the apparatus are determined by the incremental spacing of the locating points. As a result of the design of the apparatus, the adjustment operation may be accomplished by a single operator without the use of tools using only one hand to make the adjustment. Once both mounting rails of a pair or set are adjusted to the length required by the depth of the rack and installed in the rack, the electronic device, which may be a data processing device such as a server, can be set on them within the rack.

Figure 1A:
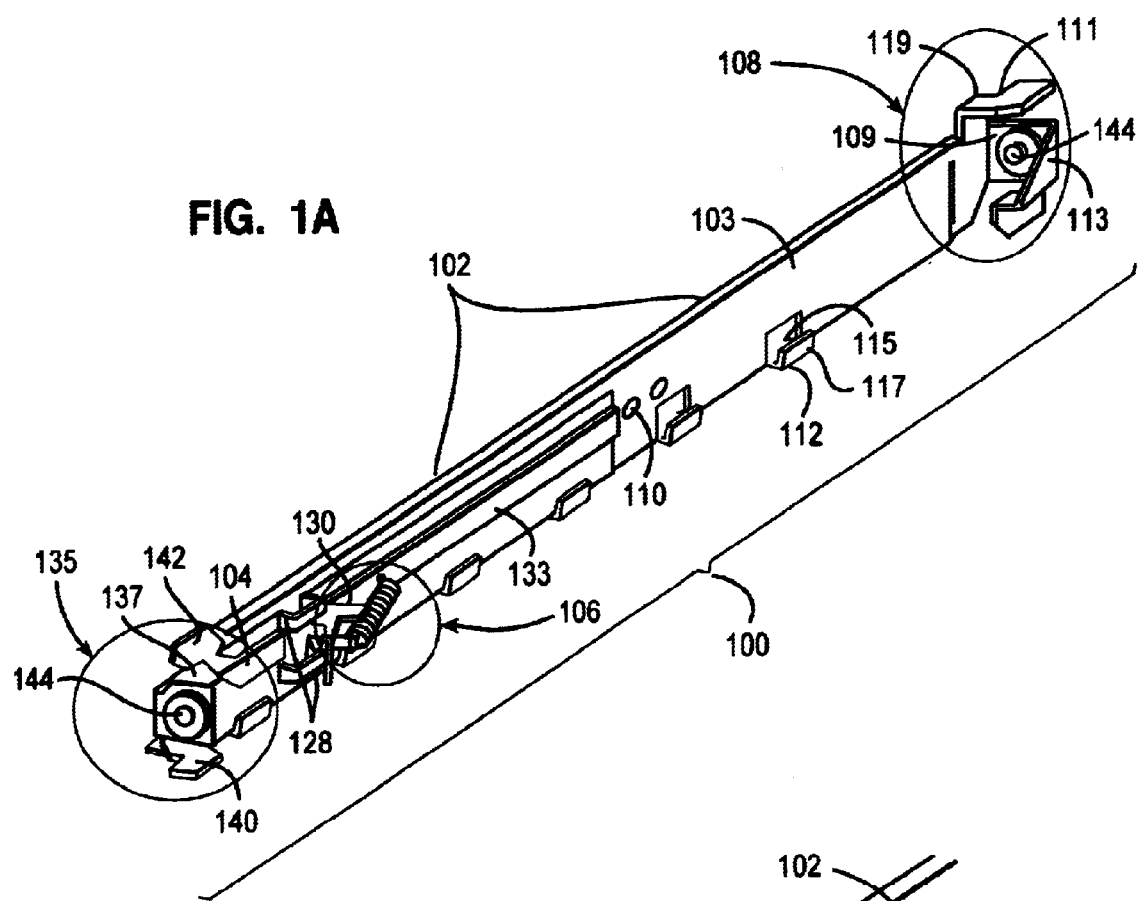
FIG. 1A depicts an embodiment of an adjustable support apparatus according to one embodiment of the present invention.
Figure 1B:
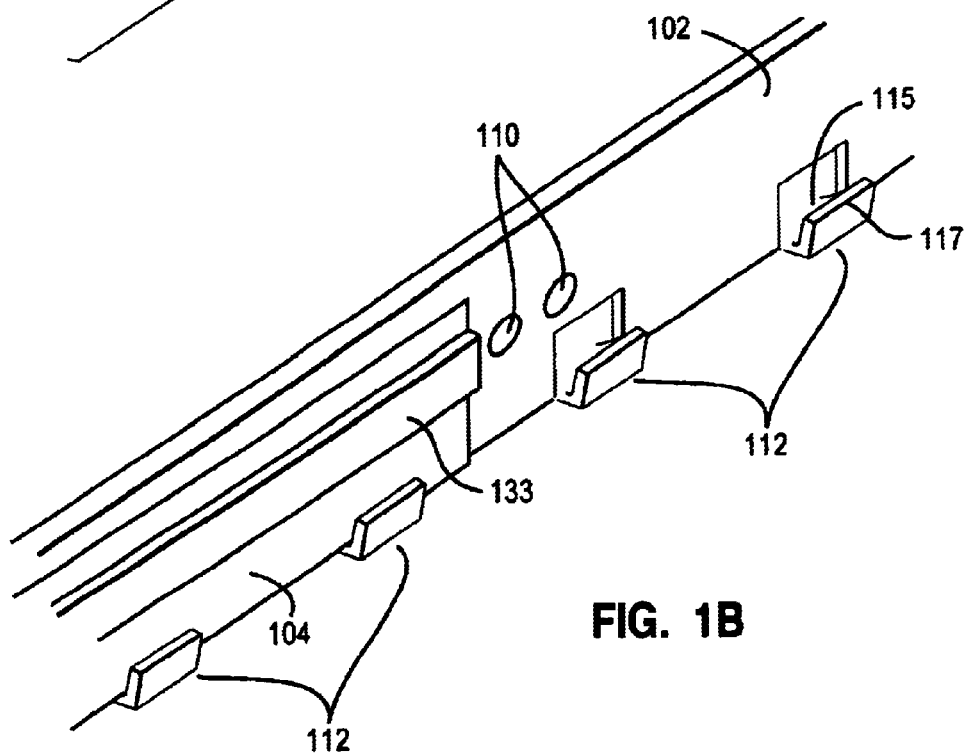
FIG. 1B depicts the features of a fixed rail member of the apparatus of FIG. 1A in greater detail.
Figure 2:
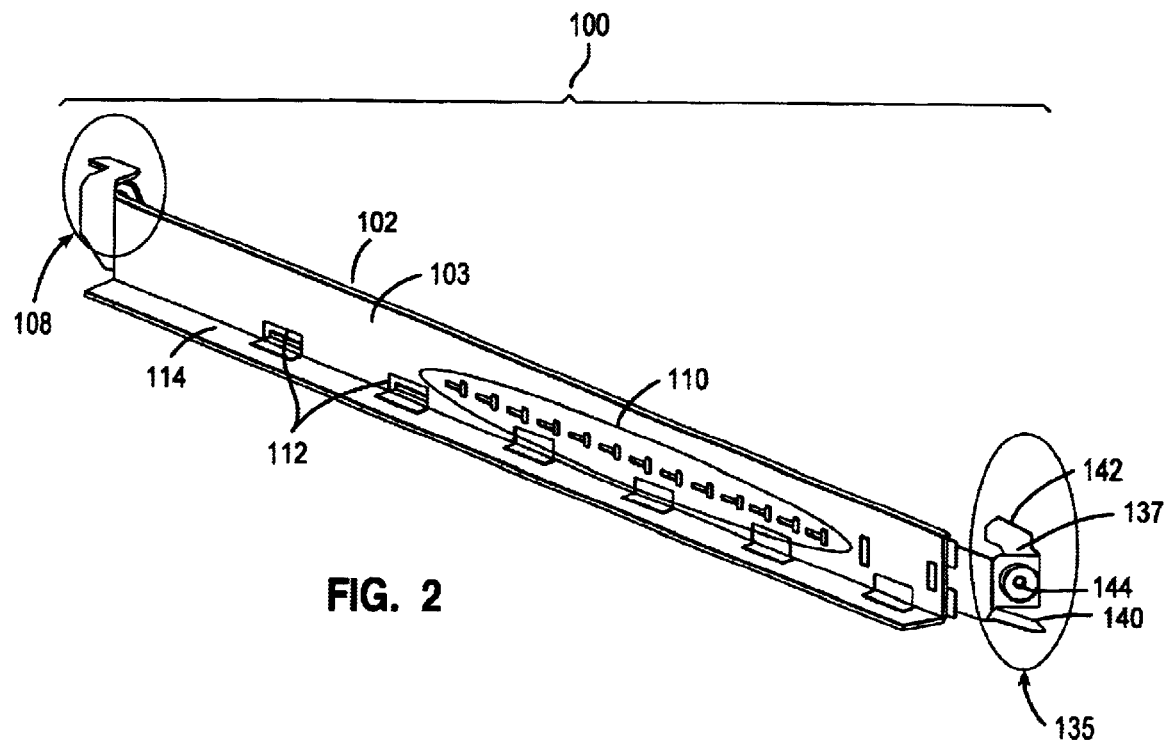
FIG. 2 is an isometric view of the apparatus of FIG. 1A as viewed from the inside (device side)

Turning now to the drawings, FIG. 1A, FIG. 1B, and FIG. 2 depict an embodiment of an apparatus 100 according to the present invention suitable for creating adjustable rails for mounting an electronic device in a rack. FIG. 1A shows apparatus 100 as viewed from the "outside" relative to the rack. FIG. 1B also shows apparatus 100 as viewed from the "outside" relative to the rack, but is an enlarged view of the features in the longitudinal center of apparatus 100. FIG. 2 shows the apparatus as viewed from "inside" or device side.

In the depicted embodiment, apparatus 100 comprises a fixed rail member 102, a sliding rail member 104, and an "inch-worm" latching mechanism 106. Fixed rail member 102 receives sliding rail member 104 while latching mechanism 106 sets and maintains the relative position of fixed rail member 102 and sliding rail member 104. In this manner the length of apparatus 100 is adjusted to that required to fit into a given rack.

In the depicted embodiment, fixed rail member 102 is in the form of an L-shaped beam, comprising a vertical section 103 and a horizontal shelf 114 (which is visible in FIG. 2), both of which extend for the length of the member. The preferred embodiment envisions the vertical section 103 and horizontal shelf 114 as formed from the same piece of metal. In another embodiment the two sections 103 and 114 could be produced separately and attached to each other by a fabrication method such as welding. In an alternative embodiment, fixed rail member 102 could have a drawer slide attached to vertical section 103 in place of horizontal shelf 114. Such an embodiment would advantageously enable the electronic device to be easily pulled out of the rack for service or use.

Examining FIG. 2, horizontal shelf 114 extends substantially the entire length of fixed rail member 102. In an alternative embodiment, horizontal shelf 114 could be produced as discrete tabs also formed from fixed rail member 102. In another alternative, shelf 114 may be produced as a plurality of separate pieces and affixed to fixed rail member 102 by a process such as welding.

The depicted embodiment of fixed rail member 102 includes a set of mounting features 108 suitable for mounting fixed rail member 102 to one corner of a rack. Fixed rail member 102 also comprises a plurality of locating points 110 that inter-act with latching mechanism 106 to set and maintain the overall length of the apparatus 100. Several locating points 110 are visible in FIG. 1A where sliding rail member 104 does not conceal them. Fixed rail member 102 also includes a plurality of tabs 112 that receive sliding rail member 104.

Continuing with the depicted embodiment of fixed rail member 102, it will be appreciated by one skilled in the art that member 102 is implemented as a cantilever beam. In this implementation, the fixed end of the beam is connected to the rack via the set of mounting features 108. The weight of the electronic device, which may be a data processing device such as a server, rests on shelf 114 (shown in FIG. 2) and is supported by fixed rail member 102 and its attachment to the rack through mounting features 108.

The stiffness of fixed rail member 102, which determines the amount of weight it can support without excessive deflection, is a function of the height of vertical section 103. Another factor that influences the stiffness of fixed rail member 102 is the thickness of the material from which fixed rail member 102 is made. In addition, the width of shelf 114 and the modulus of elasticity of the material selected for the member influence the stiffness.

In one embodiment, it is envisioned that fixed rail member 102 is made from cold rolled, low carbon steel of a temper capable of being formed as required to produce the design. Other materials, such as aluminum alloys, may be used, but low carbon, cold rolled steel provides advantages of cost, formability, and stiffness (modulus of elasticity) that one skilled in the art will appreciate. The height of vertical section 103 may be established during the design process such that fixed rail member 102 will have sufficient stiffness to support the weight of an electronic device such as a server.

In an embodiment wherein fixed rail member 102 is made of steel, it may be plated with a material such as nickel to provide a measure of protection against atmospheric corrosion. Alternatively, fixed rail member 102 may be plated with a lower cost plating such as zinc if a lower measure of corrosion prevention is required. If cost is of primary concern, fixed rail member 102 may be made from preplated steel such as electrogalvanized steel. While this alternative leaves the cut edges of the part unprotected, this may be acceptable in certain commercial applications and provides a significant advantage in terms of cost. The discussion of possible materials and platings of fixed rail member 102 is not intended to limit the anticipated variations or embodiments, but to make clear the advantages of the current invention.

In the depicted embodiment, mounting features 108 of fixed rail member 102 are formed as an integral portion of the member. The set of mounting features 108 comprises a plate 109 and two wings 111 and 113. Plate 109 is at a right angle to the long axis of fixed rail member 102. Wing 111 is parallel to shelf 114 and extends rearwards (relative to the direction of the rack) at the top distal end 119 of fixed rail member 102. Wing 113 is parallel to fixed rail member 102 and is offset from it in the lateral dimension outward from fixed rail 102 by plate 109. Plate 109 includes a circular aperture 144. In this embodiment, apparatus 100 may be attached to the rack by a fastener inserted through aperture 144.

Mounting features 108 may be formed as integral sections of fixed rail member 102. In another embodiment, mounting features 108 may comprise a separate set of parts to be attached to fixed rail member 102. In this manner, different types of mounting hardware may be accommodated by the present invention.

Figure 3:
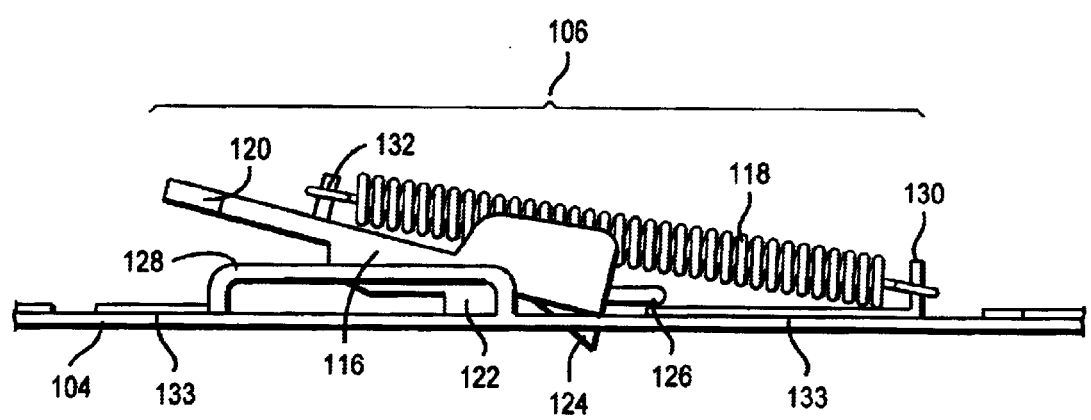
FIG. 3 is a top view of an embodiment of a latching mechanism and sliding rail of the apparatus.

Continuing with FIGS. 1A, 1B, and 2, fixed rail member 102 includes a plurality of locating points 110 which interact with latching mechanism 106 to set and maintain the length of apparatus 100. As shown in the depicted embodiment, locating points 110 comprise pierced holes, located at regularly spaced intervals along the horizontal centerline of vertical section 103. This is seen most clearly in FIG. 2 where locating points 110 are viewed from the device side of apparatus 100. In FIG. 1, several of locating points 110 may be seen where they are not covered by sliding rail member 104. In other embodiments, locating points 110 may comprise embossed dimples in vertical section 103 of fixed rail member 102. The precise arrangement of locating points 110 is not crucial to the current invention as long as they match with the geometry of latching mechanism 106. In one embodiment, locating points 110 are implemented as pierced holes with the protrusion produced by piercing toward the outer side of vertical section 103. Raised section 133 on sliding rail member 104 clears the protrusions, allowing relative motion of sliding rail member 104 and fixed rail member 102, while simultaneously providing increased engagement with the latch point 124 of latch lever 116. Details of latch lever 116 are shown in FIG. 3 and will be discussed later. In an alternative embodiment, locating points 110 may be implemented as simple apertures in vertical section 103 of fixed rail member 102. Raised section 133 of the sliding rail 104 would not then be required to allow relative motion.

The spacing of locating points 110 in the longitudinal dimension determines the gross granularity of adjustment of apparatus 100. In one embodiment, a spacing of one inch between locating points 110 is envisioned. In other embodiments, other incremental distances could be used, such as spacings which conform to a metric dimension to accommodate rack depths in metric standard measurements.

Fixed rail member 102 also includes a plurality of tabs 112, which receive sliding rail member 104. In the depicted embodiment, tabs 112 are formed as an integral part of fixed rail member 102 and comprise a horizontal section 115 and a vertical lip 117. The configuration of tabs 112 is more clearly seen in FIG. 1B. The height of lip 117 is sufficient to restrain any lateral movement of sliding rail member 104 relative to fixed rail member 102. In another embodiment, tabs 112 could be produced as separate pieces of material and attached to fixed rail member 102 by a fabrication method such as welding.

It will be appreciated by one skilled in the art that fixed rail member 102 may be manufactured from low carbon, cold rolled steel in strip or coil form by stamping and forming. In this process, the outside perimeter of the member is defined by action of stamping stations in what is known as a progressive die set. Forming stations in the same progressive die set form the various features of fixed rail member 102, such as tabs 112, shelf 114, and set of mounting features 108. While other processes may be used, such as fabricating the individual features and then assembling them by a process such as welding, stamping and forming is an advantageous process in that it is typically a lower cost process than assembling fixed rail member 102 from discrete pieces.

In the depicted embodiment, sliding rail member 104 is seen in its position relative to fixed rail member 102. Sliding rail member 104 is received within the plurality of horizontal tabs 112 on the outside (relative to the electronic device to be mounted in the rack) of vertical surface 103 of fixed rail member 102. As seen in FIG. 2 sliding rail member 104 comprises a set of mounting features 135. In FIG. 1A, sliding rail member 104 also comprises an attachment point 130 for a tension member 118 of a latching member 106 (discussed in greater detail below), a plurality of ribs 128, and a raised center section 133.

Mounting features 135 of sliding rail member 104 are visible at the proximal end and outside of apparatus 100 (relative to the position of the electronic device in the rack). Mounting features 135 act in combination with mounting features 108 of fixed rail member 102 (at the distal end of apparatus 100) to attach apparatus 100 to the rack. In this embodiment, mounting features of the sliding rail member 102 are typically similar to and compatible mounting features 108 of fixed rail member 102.

In the depicted embodiment, mounting features 135 of sliding rail member 104 are formed as an integral portion of member 104, and similarly for mounting features 108 of fixed rail 102. Mounting features 135 comprise a plate 137 that is at a right angle to the long axis of fixed rail 104 and two wings 140 and 142. Wing 140 is parallel to shelf 114 of fixed rail member 102 and extends forward (relative to the direction of the rack) at the bottom surface of sliding rail member 104. Wing 142 is parallel to vertical section 103 of fixed rail member 102 and is offset from the body of sliding rail member 104 in the lateral dimension outward from fixed rail member 102 by plate 137. In an alternative embodiment, wings 140 and 142 may be implemented as cylinders affixed to plate 137. Said cylinders could be pins, stepped pins, or compression pins which mate with racks having differing mounting hole sizes. Plate 137 includes a circular aperture 144. Other embodiments of mounting features 135 may be used, dependent upon the requirements of the rack to be used. As an example, circular aperture 144 may take a geometric form other than a circle and need not be the same as aperture 109 of mounting features 108 of the fixed rail member 102 as required by the rack in use. Typically, apparatus 100 is attached to the rack by a fastener inserted through aperture 144 in mounting features 135.

In the depicted embodiment, mounting features 135 are formed as integral sections of fixed rail member 104. In another embodiment, mounting features 135 may be implemented as a separate set of parts to be attached to sliding rail member 104. In such a manner, different types of mounting hardware may be accommodated by the present invention.

Turning to FIG. 3, a top down view of sliding rail member 104 with latching mechanism 106 affixed to it is depicted. Particularly evident in FIG. 3 is attachment point 130 for tension member 118. In the depicted embodiment, attachment point 130 is a tab that is fixedly attached to and formed at a right angle to sliding rail member 104. Attachment point 130 includes an aperture (not evident in the drawings) to which tension member 118 is attached. In another embodiment, the attachment point could be produced as a hook structure which is subsequently attached to sliding rail member 104.

Continuing with FIG. 3, ribs 128 are shown in profile in the top down view. Ribs 128 serve to constrain latching mechanism 106 to sliding rail member 104. In the depicted embodiment, ribs 128 are formed from sliding rail member 104 as a pair of arch shaped structures, which are cut from sliding rail member 104 and formed outward from it. In one embodiment, ribs 128 comprise a pair of structures as described above which contact and constrain opposing pivot arms 122 of latch lever 116, which will subsequently be described in greater detail.

Further continuing with FIG. 3, sliding rail member 104 also includes a raised center section 133. In one embodiment, raised center section 133 is integral to sliding rail member 104 and is produced by displacing the material along the horizontal centerline of sliding rail member 104 outward (relative to the electronic device) by a specified amount. The amount of the offset of raised center section 133 will be seen as determining the engagement of latch point 124 of latching mechanism 106 with fixed rail member 102. The presence of raised center section 133 also provides a clearance over the protrusion of punched locating points 110 and provides a larger area of engagement with latch point 124.

It will be appreciated by one skilled in the art that sliding rail member 104, like fixed rail member 102, may also be produced as a stamped and formed part from low carbon, cold rolled steel. While member 104 could also be fabricated from individual components attached to each other by a process such as welding, stamping and forming provides advantages of cost and simplicity. In the preferred embodiment, sliding rail member 104 may be made of low carbon, cold rolled steel.

If made from steel, sliding rail member 104 may be plated with a material such as zinc to provide protection against atmospheric corrosion. Alternatively, sliding rail member 104 may be made from precoated steel such as electrogalvanized steel, if the lack of corrosion protection at the stamped edges is acceptable for the application. In yet another embodiment, sliding rail member 104 may be made from a stainless steel alloy, incurring a cost penalty for the material, but eliminating the need for a subsequent finishing operation. As with fixed rail member 102, the discussion of possible materials and finishes for sliding rail member 104 is not intended to limit the anticipated variations or embodiments, but to make clear the advantages of the current invention.

As has been previously discussed, in the depicted embodiment fixed rail member 102 receives sliding rail member 104 in tabs 112 formed at the bottom surface of fixed rail member 102, as can be seen in FIG. 1A. In this embodiment, sliding rail member 104 provides a physical extension of apparatus 100 to connect to the front corner of the rack and, while it is implemented as a cantilever beam, it carries none of the load of the electronic device.

In an alternative embodiment, another plurality of tabs could be formed from or attached to the top surface of fixed rail member 102. This plurality of tabs would typically oppose the plurality of tabs 112 and would contact the top surface of sliding rail member 104 and serve to mechanically couple sliding rail member 104 to fixed rail member 102. The effect of this mechanical coupling would be to transfer a portion of the weight of the electronic device being mounted to sliding rail member 104. The force on sliding rail member 104 resulting from the weight of the electronic device would then be transferred to the front corner support of the rack through mounting features 135. In the alternative embodiment, sliding rail member 104 acts in combination with fixed rail member 102 to form a doubly supported beam with both ends fixed. In this configuration, apparatus 100 could support a heavier electronic device. In another embodiment, a single continuous lip located at the top surface of fixed rail member 102 could be used in place of a plurality of discrete tabs to transfer the weight of the electronic device from fixed rail member 102 to sliding rail member 104.

Now turning to latching mechanism 106, FIG. 3 depicts an embodiment of "inch-worm" latching mechanism 106 in its position on sliding rail member 104 shown in top view. In this embodiment, latching mechanism 106 comprises a latch lever 116 and a tension member 118.

Turning to latch lever 116, which is shown in profile view from the top in FIG. 3, latch lever 116 includes a handling tab 120, a pair of opposing pivot arms 122, a latch point 124, a catch 126, and an attachment point 132 for tension member 118. Latch lever 116 is constrained to sliding rail member 104 by ribs 128 that may be formed from sliding rail member 104 and contact opposing pivot arms 122 and by catch 126 which contacts sliding rail member 104. Opposing pivot arms 122 extend at right angles to the body of latch lever 116. Tension member 118 provides the force necessary to hold pivot arms 122 of latch lever 116 against ribs 128 and catch 126 against raised center section 133.

As its name implies, latch lever 116 is a lever comprising a rigid bar pivoted on a fixed point and used to transmit force, as in raising or moving a weight at one end, by pushing down on the other. Handling tab 120 is a point at which force may be applied. Attachment point 132 for tension member 118 is the other point to which the force (weight) to be opposed is exerted. Opposing pivot arms 122 form the fixed point upon which the lever rotates.

In the depicted embodiment, latch point 124 of latch lever 116 is a point which protrudes through sliding rail 104 at one locating points 110 on fixed rail member 102. It is located at the end of latch lever 116 opposite to handling tab 120. In the depicted embodiment, latch point 124 is located at the distal end of latch lever 116, the end farthest away from the front of the rack. The protrusion of latch point 124 into one of the plurality of locating points 110 prevents relative motion between fixed rail member 102 and sliding rail member 104, thus setting the overall length of apparatus 100.

Continuing with latch lever 116, as shown in FIG. 3, catch 126 of latch lever 116 contacts raised center section 133 of sliding rail member 104 when latch mechanism 106 is engaged. When latch mechanism 106 is engaged, the insertion of latch point 124 into any of locating points 110 that are integral to fixed rail member 102 sets the gross adjustment of the length of apparatus 100. The location of the outer surface of raised center section 133 and the placement of catch 126 on latch lever 116 combine to determine the depth to which latch point 124 penetrates into one of the plurality of locating features 110.

Continuing further with latch lever 116, it is seen that in the embodiment portrayed in FIG. 3, handling tab 120 is located at the proximal end of latch lever 116 with latch point 124 at the distal end. Handling tab 120 is formed on latch lever 116 to produce a flat surface parallel to the vertical surface of sliding member 104. The installer pushes upon handling tab 120 to disengage latch mechanism 106. In the depicted embodiment, handling tab 120 is shown as an integral part of latch lever 116. In an alternative embodiment, it may be formed as a separate part and affixed to latch lever 116 by welding.

As a further refinement, handling tab 120 may be coated in some colorful, comfortable-to-touch material such as vinyl. Such coating may be done either in a dip process or by the application of a separate handling tab cover. By these means the handling tab is prominently marked as a point to be contacted by an installer, a human factors benefit.

Continuing with latch lever 116, it can be seen in the embodiment pictured in FIG. 3 that latch lever 116 includes an opposing pair of pivot arms 122. As the name implies, these arms, which protrude from each side of latch lever 116 in the area of the center of latch lever 116, act as pivots about which latch lever 116 rotates. Pivot arms 122 are engaged by ribs 128 of fixed rail member 102 and are held in place against ribs 128 by the force applied by tension member 118.

In the depicted embodiment, latch lever 116 includes an attachment point 132 for tension member 118. In this embodiment, attachment point 132 is a tab formed outward and perpendicular to the flat surface of latch lever 116. Attachment point 132 includes an aperture into which tension member 118 affixes.

It will be understood by one skilled in the art that latch lever 116 is a complex, 3-dimensional part. In the embodiment shown in the accompanying drawings, latch lever 116 is envisioned as a casting. In casting, molten metal is poured into a mold that is a hollow form replicating the negative geometry of the part to be produced. When the molten metal solidifies, the part is produced. The use of a casting process allows the formation of a complex 3-dimensional geometry.

The choice of material for latch lever 116 is dependent upon the process to be used and the strength requirements imposed by tension member 118. A possible material is a zinc alloy, which provides advantages of lower cost over other casting alloys.

In an alternative embodiment, latch lever 116 may be produced as a stamped and formed part from cold rolled, low carbon steel. Handling tab 120 is twisted 90 degrees relative to latch lever 116 body in a forming operation to produce the required geometry. Attachment point 132 may be formed from latch lever 116 body as well. Lever arms 122 can be added to the basic stamping in the form of a pin with a larger center section that is press-fit into an aperture in latch lever 116. The formation of latch lever 116 as a stamped and formed part may provide advantages of cost over a cast part. Electroplating may be done after forming to provide additional corrosion prevention. Similar to fixed rail member 102 and sliding rail member 104, latch lever 116, if produced as a stamped and formed part, may be produced from precoated steel such as electrogalvanized steel if bare steel edges are acceptable for the application.

Continuing to tension member 118, the force provided by tension member 118 is balanced by the force of pivot arms 122 against ribs 128 of sliding rail member 102 and catch 126 against sliding rail member 104. Tension member 118 may be any appropriate material and form which provides the force and deflection necessary to maintain engagement of latch point 124 with one of locating points 110 in fixed rail member 102 and to allow the rotation of latch lever 116 required to engage or disengage latch point 124. One embodiment of tension member 118 is as a coil extension spring, as shown in FIG 3. In an alternative embodiment tension member 118 may be in the form of elastic bands which will also provide the necessary force.

Figure 4:
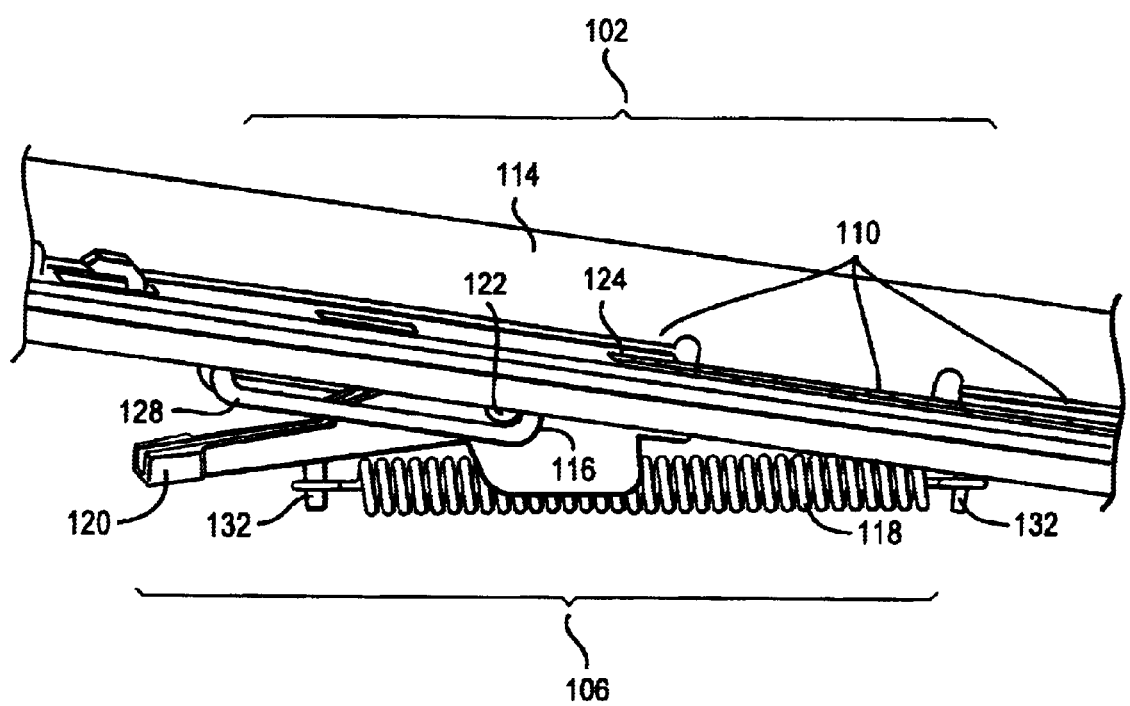
FIG. 4 illustrates greater detail of a latching mechanism of the apparatus of FIG. 1A.

FIG. 4 depicts an embodiment of apparatus 100 showing latching mechanism 106 in close up view, as viewed from the device side of the apparatus. Latching mechanism 106 is visible on the outside of apparatus 100 with handling tab 120 of latch lever 116 located in the "up" position—displaced away from what would be the inside of the rack. Tension member 118 is also seen, stretched between attachment points 130 and 132. Latch point 124 is shown protruding through one of locating points 110 in fixed rail member 102, thus setting the gross length of the adjustable rail apparatus. Catch 126 rests against sliding rail member 104, preventing over engagement of the latching mechanism. In an alternative embodiment, latch mechanism 106 could be positioned on the inside of apparatus 100 and fixed rail member 102 is received in sliding rail member 104. Mounting features 108 and 135 are modified to face inward within the rack and horizontal shelf 114 is modified in width to accommodate the increased distance between the pair of apparatus 100.

To adjust the length of apparatus 100, handling tab 120 is depressed inward toward rails 102 and 104 by the installer, latch lever 116 rotates on pivot arms 122, and latch point 124 moves out of a particular locating points 110, allowing fixed 102 and sliding 104 rails to move relative to each other. When a length slightly larger than the desired length of apparatus 100 is reached, handling tab 120 is released and is pulled outward away from rails 102 and 104 by tension member 118. Latch lever 116 pivots on pivot arms 122 and latch point 124 inserts into another one of locating points 110. Catch 126 comes to rest against raised center section 133 of sliding rail member 104. Apparatus 100 is inserted into the rack between front and back vertical posts. Upon insertion into the rack, the length of apparatus 100 decreases by a fine longitudinal movement of sliding rail member 104 relative to fixed rail member 102. Said fine movement is made possible by the relative length of ribs 128 and opposing pivot arms 122. Ribs 128 are longer than pivot arms 122, thus allowing latch lever 116 to move on pivot arms 122 within the length of ribs 128. Tension member 118 extends to accommodate the relative longitudinal movement of fixed rail member 102 and sliding rail 104. By means of the relative motion of the two rails, 102 and 104, after the gross length of apparatus 100 is fixed, fine differences in rack depths may be accommodated, thus allowing fine adjustment of the length of apparatus 100.

It will be apparent to those skilled in the art having the benefit of this disclosure that the present invention contemplates an improved apparatus to create adjustable side rails for a mounting rack. The installation of apparatus 100 requires only one installer to adjust and set the length of the rails without tools. Thus a supplier of a device such as a server is freed from the problem of supplying specific length rails for racks of differing depths which a customer for the device may already own. It is understood that the form of the invention shown and described in the detailed description and the drawings are to be taken merely as presently preferred examples. It is intended that the following claims be interpreted broadly to embrace all variations of the preferred embodiments disclosed.

What is claimed is:

1. An adjustable apparatus for supporting an electronic device within a rack comprising:
   a fixed rail member;
   a sliding rail member adjustably receivable within the fixed rail member; and
   a latching mechanism that maintains the sliding and fixed rail members to define a length of the apparatus that accommodates a dimension of the rack;
   wherein the sliding rail member comprises:
      a plurality of ribs which interact with the latching mechanism;
      a raised center section upon which the latching mechanism rests; and
      an attachment point to which a tension member attaches
   wherein the latching mechanism comprises a lever body attached to a tension member; and
   wherein the tension member comprises a coil spring.

2. The apparatus of claim 1, wherein the fixed rail member is an L-shaped bracket comprising:
   a vertical section;
   a plurality of locating points which interact with the latching mechanism to maintain the position of the fixed and sliding rails;
   a plurality of tabs suitable for receiving the sliding rail member; and
   at least one mounting feature suitable for attaching to the rack.

3. The apparatus of claim 2 wherein the locating points are located at predetermined and fixed distances from each other, thereby creating a predetermined granularity in the adjustment of the length of the apparatus.

4. The apparatus of claim 2 wherein the plurality of tabs which receive the sliding rail member are located at the bottom of the fixed rail member and are configured to prevent lateral motion of the sliding rail member.

5. The apparatus of claim 1, wherein the lever body comprises:
   a handling tab identified by a characteristic selected front a group of characteristics consisting of color and shape as an item to be activated by a customer;
   a pair of opposing pivot arms located at the center of rotation of the lever body;
   a latch point located at an opposite end of the lever body from the handling tab; and
   a catch that interacts with the sliding rail member.

6. The apparatus of claim 5 wherein the pivot arms of the lever body are constrained by ribs of the sliding member through a force applied by the tension member.

7. The apparatus of claim 6 wherein the latch point interacts with the fixed rail member to couple the fixed rail member and the sliding rail member by engaging one of a plurality of locating points on the fixed rail member.

8. The apparatus of claim 7 wherein the length of the apparatus is adjusted by depressing the handling tab, causing the fever body to rotate on the pivot arms, thus disengaging the latch point from the locating points fixed rail and allowing the rails to move relative to each other.

9. The apparatus of claim 7 wherein the length of the apparatus is set by releasing the handling tab, causing the lever body to rotate on the pivot arms from the force applied by the tension member, and allowing the latch point to reengage the one or more of the plurality of locating points on the fixed rail member.

10. The apparatus of claim 1, where the tension member comprises an elastomeric material with attachment features that conform to the attachment features on the lever body and the sliding rail member.

11. An apparatus for supporting an electronic device in a rack, comprising:
   a fixed rail member and a sliding rail member adjustably receivable within the fixed rail member;
   means for attaching the sliding rail to the rack; and a latch, comprising a coil spring connected to a lever body, to maintain the length of the sliding rail at a determined length to accommodate the rack.

wherein the lever body comprises:
- a handling tab identified by a characteristic selected from a group of characteristics consisting of color and shape as an item to be activated by a customer;
- a pair of opposing pivot arms located at the center of rotation of the lever body;
- a latch point located at an opposite end of the lever body from the handling tab;
- a catch that interacts with the sliding rail member; and
- an attachment point for the coil spring.

12. The apparatus of claim 11, wherein the latch point interacts with the fixed rail member to couple the fixed rail member and the sliding rail member by engaging one of a plurality of locating points an the fixed rail member.

13. A system for supporting an electronic device server comprising:
- a rack comprising a substantially rectilinear frame; and
- at least one pair of adjustable support rails attached to the rack, each support rail comprising:
  - a fixed rail member;
  - a sliding rail member adjustably receivable within the fixed rail member; and
  - a latching mechanism, including a coil spring attached to a lever body, that maintains the relative positions of the sliding and fixed rail members to define a length of the apparatus that accommodates a dimension of the rack;

wherein the sliding rail member comprises:
- at least one mounting feature suitable for attaching the sliding rail member to the rack;
- a plurality of ribs which interact with the latching mechanism;
- a raised center section upon which the latching mechanism rests; and
- an attachment point to which the coil spring attaches.

14. The system of claim 13 wherein the fixed rail member is an L-shaped bracket comprising:
- a vertical section;
- a horizontal shelf upon which one end of the electronic device rests;
- a plurality of locating points which interact with the latching mechanism to maintain the position of the fixed and sliding rails;
- a plurality of tabs suitable for receiving the sliding rail member; and
- at least one mounting feature suitable for attaching to the rack.

* * * * *